United States Patent
Gong

(10) Patent No.: US 11,309,180 B2
(45) Date of Patent: Apr. 19, 2022

(54) ULTRA-LOW K DIELECTRIC LAYER AND MANUFACTURING METHOD THEREOF

(71) Applicant: Shanghai Huali Integrated Circuit Mfg. Co., Ltd., Shanghai (CN)

(72) Inventor: Yiqi Gong, Shanghai (CN)

(73) Assignee: Shanghai Huali Integrated Circuit Mfg. Co. Ltd, Shanghai (CN)

(*) Notice: Subject to any disclaimer, the term of this patent is extended or adjusted under 35 U.S.C. 154(b) by 0 days.

(21) Appl. No.: 16/868,540

(22) Filed: May 7, 2020

(65) Prior Publication Data

US 2020/0357632 A1    Nov. 12, 2020

(30) Foreign Application Priority Data

May 8, 2019   (CN) .......................... 201910378715.3

(51) Int. Cl.
  *H01L 21/02*     (2006.01)
(52) U.S. Cl.
  CPC .... *H01L 21/0234* (2013.01); *H01L 21/02203* (2013.01); *H01L 21/02271* (2013.01)
(58) Field of Classification Search
  CPC ........... H01L 21/0234; H01L 21/02203; H01L 21/02271; H01L 21/02216; H01L 21/02126; H01L 21/02109
  See application file for complete search history.

(56) References Cited

U.S. PATENT DOCUMENTS

| | | | | |
|---|---|---|---|---|
| 2003/0148630 A1* | 8/2003 | Hu | .................... | H01L 21/02282 438/781 |
| 2005/0118799 A1* | 6/2005 | Wu | .................... | H01L 21/76829 438/624 |
| 2007/0232082 A1* | 10/2007 | Balseanu | ............ | H01L 21/0217 438/789 |
| 2008/0070421 A1* | 3/2008 | Xu | .......................... | C23C 16/30 438/786 |

OTHER PUBLICATIONS

Machine Translation of CN 106910710.*

* cited by examiner

*Primary Examiner* — Julia Slutsker
(74) *Attorney, Agent, or Firm* — Adsero IP

(57) ABSTRACT

The disclosure provides an ultra-low K dielectric layer and a manufacturing method thereof, the manufacturing method comprising: forming an ultra-low K dielectric layer on a substrate; forming a thin oxygen layer on the upper surface of the ultra-low K dielectric layer; performing plasma purge on the ultra-low K dielectric layer after forming the thin oxygen layer using oxygen; and the plasma purge lasts for more than 2 seconds. The ultra-low K dielectric layer manufactured according to the manufacturing method provided by the disclosure has a smooth surface, overcomes the original bump defects of the ultra-low K dielectric layer, and improves the performance of the ultra-low K dielectric layer. The manufacturing method of the ultra-low K dielectric layer provided by the disclosure has a simple process, is compatible with the manufacturing process of the existing ultra-low K dielectric layer, and has operability.

16 Claims, 4 Drawing Sheets

ULTRA-LOW K DIELECTRIC LAYER AND MANUFACTURING METHOD THEREOF

CROSS-REFERENCES TO RELATED APPLICATIONS

The present application claims priority to Chinese Patent Application No. 201910378715.3, filed on May 8, 2019, entitled "ULTRA-LOW K DIELECTRIC LAYER AND MANUFACTURING METHOD THEREOF", which is incorporated by reference herein for all purposes.

FIELD

The present disclosure relates to the field of semiconductor structures and manufacturing processes thereof, and in particular to an ultra-low K dielectric layer structure and its manufacturing method.

BACKGROUND

Since the early days of Dr. Jack Kilby of Texas Instruments invented integrated circuits (ICs), scientists and engineers have made numerous disclosures and improvements in semiconductor devices and processes. In the past 50 years, semiconductor size has been significantly reduced, which transfers into increasing processing speed and decreasing power consumption.

In some embodiments of semiconductor technology that interconnect delay is a major limiting factor in driving the speed and performance of integrated circuits. A common method currently used to minimize interconnect delay is to reduce the interconnect capacitance by using a low dielectric constant (low-k) material as the interlayer insulating dielectric of the metal layer in the integrated circuit device.

Therefore, in recent years, low-k materials (such as silicon dioxide) have been developed to replace high dielectric constant insulating materials. In one embodiment, low K films are used between dielectric layers and within dielectric layers between metal layers in semiconductor devices. At present, a low-k dielectric layer can be deposited by a spin-on-deposition (SOD) method (similar to a method of adding a photoresist) or by a chemical vapor deposition (CVD) method. which makes low-k materials compatible with existing conventional semiconductor fabrication processes.

Moreover, with the gradual improvement in the performance requirements of semiconductor devices, it has been desired to further reduce the dielectric constant of the insulating material, and the dielectric constant of the interlayer dielectric layer is less than 2.5. A dielectric material having a dielectric constant lower than 2.5 is generally considered to be an ultra low K (ULK) dielectric material. One way to form an ultra-low K dielectric film is to form a porous low-k dielectric film, that is, the dielectric constant of the material film can be further reduced by making the formed low-k material film have pores.

However, in the prior art, when the above-described ultra-low K dielectric layer is formed by chemical vapor deposition in a compatible manner, the surface of the formed ultra-low K dielectric layer has a bump defect for various reasons. The surface of the ultra-low K dielectric layer is uneven, which affects the performance of the dielectric layer between the metal layers and affects the overall performance of the semiconductor device.

Therefore, there is a need for an ultra-low K dielectric layer manufacturing method and forming an ultra-low K dielectric layer having no bump defects by a simple process flow, and allowing the formed ultra-low K dielectric layer to retain the original electrical characteristics, not negatively affecting the original performance of the ultra-low K dielectric layer, and improving the overall performance of the semiconductor device.

SUMMARY

A brief summary on one or more aspects is given below to provide the basic understanding for these aspects. This summary is not an exhaustive overview of all the contemplated aspects and is neither intended to indicate critical or decisive elements of all aspects nor to attempt to define the scope of any or all aspects. Its sole purpose is to present some concepts of one or more aspects in a simplified form as a preface for a more detailed description presented later.

In order to solve the above problems, the present disclosure provides a manufacturing method for an ultra-low K dielectric layer, the manufacturing method comprising:
  forming an ultra-low K dielectric layer on a substrate;
  forming a thin oxygen layer on the upper surface of the ultra-low K dielectric layer;
  performing plasma purge using oxygen on the ultra-low K dielectric layer after forming the thin oxygen layer; and
    the plasma purge lasts for more than 2 seconds.

In an embodiment of the above manufacturing method, the plasma purge lasts for 4 to 20 seconds.

In an embodiment of the above manufacturing method, the plasma purge lasts for 15 seconds.

In an embodiment of the above manufacturing method, the thin oxygen layer has a thickness of 10 angstroms.

In an embodiment of the above manufacturing method, the thin oxygen layer is formed using diethoxymethylsilane, α-terpinene and oxygen.

In an embodiment of the above manufacturing method, the ultra-low K dielectric layer is formed using diethoxymethylsilane and α-terpinene; and the flow rate of diethoxymethylsilane and α-terpinene used to form the thin oxygen layer is smaller than the flow rate of diethoxymethylsilane and α-terpineene used to form the ultra-low K dielectric layer.

In an embodiment of the above manufacturing method, for forming the thin oxygen layer, the flow rate of diethoxymethylsilane used is 400 sccm, the flow rate of α-terpinene used is 200 sccm, and the flow rate of oxygen used is 450 sccm.

In an embodiment of the above manufacturing method, the steps of forming the ultra-low K dielectric layer, forming the thin oxygen layer, and performing the plasma purge are continuously performed in the same reaction chamber.

The present disclosure also provides an ultra-low K dielectric layer prepared by using any one of the above manufacturing methods.

The present disclosure also provides a semiconductor device comprising the above ultra-low K dielectric layer.

The ultra-low K dielectric layer prepared according to the manufacturing method provided by the disclosure has a smooth surface, overcomes the original bump defects of the ultra-low K dielectric layer, and improves the performance of the ultra-low K dielectric layer. The manufacturing method of the ultra-low K dielectric layer provided by the disclosure makes the surface of the manufactured ultra-low K dielectric layer smooth and overcomes the original bump defects by additionally forming a thin oxygen layer as a protective layer in the original process and adjusting the process parameters of the plasma purge step, and not adversely affect the performance of the ultra-low K dielectric layer. The manufacturing method provided by the disclosure has a simple process, which is compatible with the manufacturing process of the existing ultra-low K dielectric layer, and has operability.

BRIEF DESCRIPTION OF THE DRAWINGS

Embodiments of the present disclosure will be better understood from the following description of the appended claims. In the figures, components are not necessarily drawn to scale, and components having similar related features or features may have the same or similar reference numerals.

Figure 1A:
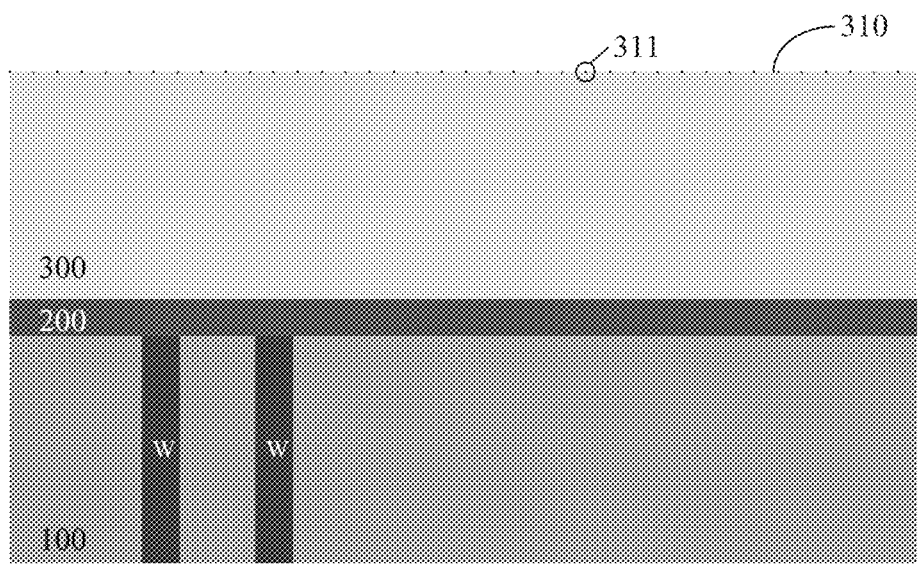
FIG. 1A is a schematic view showing the structure of an ultra-low K dielectric layer formed in the prior art.

REFERENCE SIGNS 100 metal interlayer
200 dielectric barrier
W metal tungsten
300 ultra-low K dielectric layer
310 ultra-low K dielectric layer surface
311 bump defect
400 thin oxygen layer

DETAILED DESCRIPTION

The present disclosure relates to a semiconductor process and device. In one embodiment, according to embodiments of the present disclosure, a method of manufacturing an interlayer dielectric layer of semiconductor is provided, and the interlayer dielectric layer is an ultra-low K dielectric layer. The manufacturing method provided by the present disclosure makes the surface of the ultra-low K dielectric layer smooth by forming a thin oxygen layer on the upper surface of the ultra-low K dielectric layer and performing plasma purge for the ultra-low K dielectric layer after forming the thin oxygen layer for more than 2 seconds. Therefore, the problem of bump defects on the surface of the ultra-low K dielectric layer is solved, and the original electrical characteristics of the ultra-low K dielectric layer are not changed. The performance of the ultra-low K dielectric layer is improved without negatively affecting the original performance of the ultra-low K dielectric layer. The disclosure also provides other embodiments.

The disclosure is described in detail below with reference to the drawings and specific embodiments. It is to be noted that the aspects described below in conjunction with the drawings and the specific embodiments are merely exemplary and are not to be construed as limiting the scope of the disclosure.

Note that when used, the flags left, right, front, back, top, bottom, front, back, clockwise, and counter-clockwise are used for convenience purposes only and do not imply any specific fixed direction. In fact, they are used to reflect the relative position and/or direction between various parts of an object.

As used herein, the terms "over . . . "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

Figure 1B:
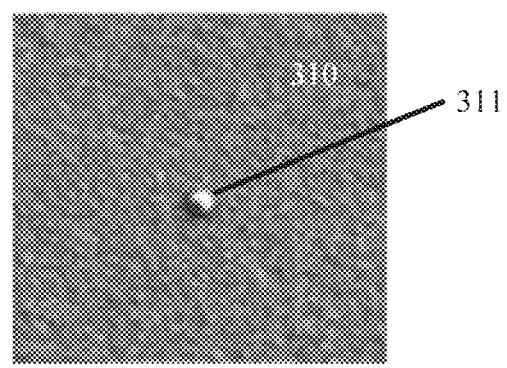
FIG. 1B shows a surface TEM image of an ultra-low K dielectric layer of the prior art.

First, please refer to FIG. 1A and FIG. 1B. FIG. 1A shows a schematic structural view of an ultra-low K dielectric layer formed by the prior art, and FIG. 1B shows a surface TEM image of an ultra-low K dielectric layer formed by the prior art. The ultra-low K dielectric layer 300 provided by the present disclosure is an interlayer dielectric layer which is usually formed in back end of line of a semiconductor device and functions as an insulating layer between the metal layer and/or the metal line in the back end. In the embodiment as illustrated in FIG. 1A, an ultra-low K dielectric layer 300 is formed on the upper surface of the dielectric barrier layer 200, and the dielectric barrier layer is formed on the upper surface of the metal interlayer 100, and, back-end connection lines such as metal vias or wires (shown as W in the drawing) are formed in the metal interlayer 100.

The ultra-low K dielectric layer formed by the prior art has a dielectric layer surface 310 that is not flat and has bump defects 311 of 0.1 um-0.2 um. Please further refer to FIG. 1B. The existence of the bump defects 311 affects the performance of the ultra-low K dielectric layer, and thus affects the overall performance of the semiconductor device. Therefore, the embodiments of the present disclosure provide an ultra-low K dielectric layer and a manufacturing method thereof. The ultra-low K dielectric layer prepared according to the manufacturing method provided by the disclosure has a smooth surface, overcomes the original bump defects of the ultra-low K dielectric layer, and improves the performance of the ultra-low K dielectric layer. The manufacturing method of the ultra-low K dielectric layer provided by the disclosure makes the surface of the manufactured ultra-low K dielectric layer smooth and overcomes the original bump defects by additionally forming a thin oxygen layer as a protective layer in the original process and adjusting the process parameters of the plasma purge step, and not adversely affect the performance of the ultra-low K dielectric layer. The manufacturing method provided by the disclosure has a simple process, which is compatible with the manufacturing process of the existing ultra-low K dielectric layer, and has operability.

Figure 2:
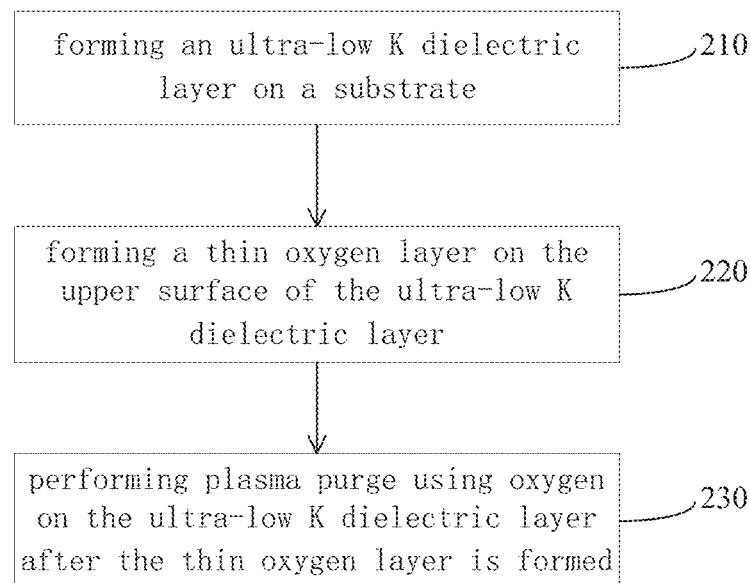
FIG. 2 is a flow chart showing a method of manufacturing an ultra-low K dielectric layer according to an aspect of the present disclosure.

In one embodiment, please refer to FIG. 2. FIG. 2 shows a flowchart of an embodiment of a manufacturing method provided by the present disclosure. The manufacturing method of an ultra-low K dielectric layer provided by the present disclosure includes step 210: forming an ultra-low K dielectric layer on a substrate; step 220: forming a thin oxygen layer on the upper surface of the ultra-low K dielectric layer; and step 230: performing plasma purge using oxygen on the ultra-low K dielectric layer after the thin oxygen layer is formed.

Figure 3A:
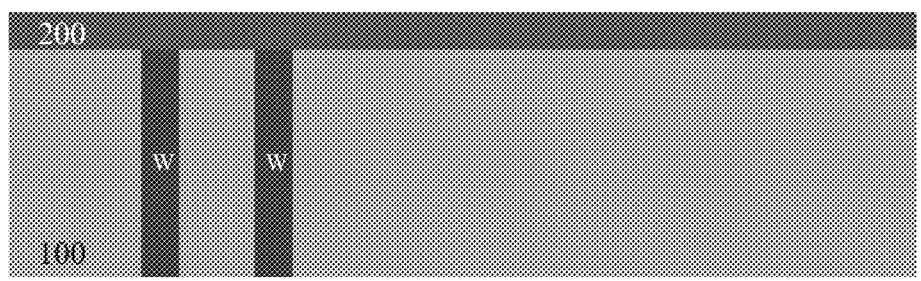
FIGS. 3A-3E are schematic structural views showing a process of the manufacturing method according to an aspect of the present disclosure.

Please further refer to FIGS. 3A-3E to understand the specific embodiments of the manufacturing method provided by the present disclosure. FIGS. 3A-3E are schematic structural diagrams during a manufacturing process according to a manufacturing method provided by the present disclosure. First, FIG. 3A illustrates the 'substrate' to which the ultra-low-K dielectric layer manufactured by the present disclosure is attached. The above substrate is a collective term for semiconductor devices before the ultra-low K dielectric layer is formed, and may include a substrate, functional devices on the substrate, functional layers, and the like. As shown in FIG. 3A, the above substrate refers to a metal interlayer 100 and a dielectric barrier layer 200 formed on the upper surface of the metal interlayer, and metal tungsten used as a metal via, a metal wire, or a metal layer is formed in the above-mentioned metal interlayer 100. In a broad sense, the above substrate should also include various functional devices, functional layers, substrates and so on before the metal interlayer 100 is formed, which are not shown in the drawings, but it does not mean that they do not exist.

Figure 3B:
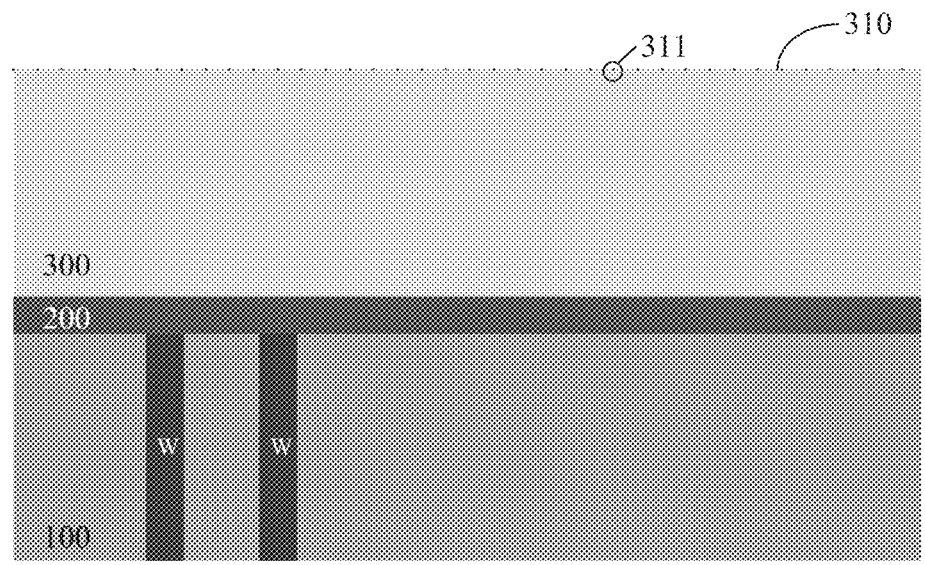
Figure 3C:
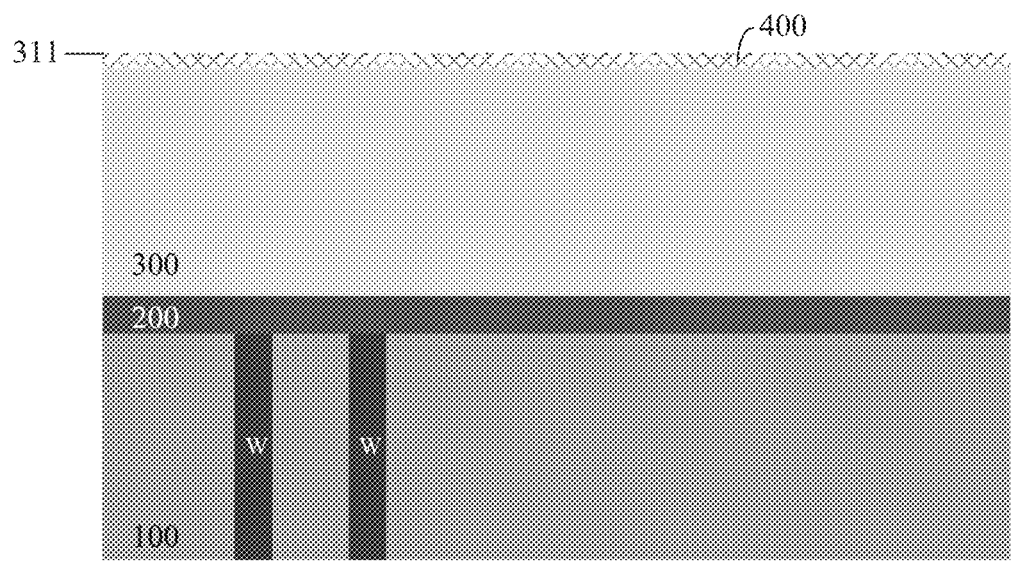

Subsequently, referring to FIG. 3B, an ultra-low-K dielectric layer 300 is formed on the upper surface of the dielectric barrier layer 200. In one embodiment, the ultra-low-K dielectric layer 300 referred to in the present disclosure means that the dielectric layer has an ultra-low dielectric constant. Further, the ultra-low dielectric constant means that the dielectric constant is less than 2.5. The above mentioned ultra-low-K dielectric may be a silicone-based material, such as an oxidized silicone or an oxidized organosilane. Such films already exist in the prior art, such as Black Diamond™ CVD organic silicate glass (OSG) film from Applied Materials or Coral™ CVD film provided by Novellus System.

In one embodiment, the manufacturing method provided by the present disclosure is to form the ultra-low-K dielectric layer 300 by chemical vapor deposition (CVD). Further, the above ultra-low-K dielectric layer 300 is formed by ion bombardment with diethoxymethylsilane (DEMS) and α-terpineneIn one embodiment, the flow rate of diethoxymethylsilane (DEMS) used to form the ultra-low-K dielectric layer 300 is 2400±10% SCCM, the flow rate of α-terpinene is 3500±10% SCCM, and the reaction temperature is 400 degrees Celsius to form an ultra-low-K dielectric layer 300 having a thickness of 850±10% angstroms. Since the ultra-low-K dielectric layer 300 is used as an insulation layer, a predetermined thickness is required to ensure the insulation effect.

During this process, some unreacted gases and materials undergo additional reactions to cause bump defects 311, making the surface of the ultra-low-K dielectric layer 310 uneven, and affecting the properties of the ultra-low-K dielectric layer 300 itself. It also affects the formation of subsequent film layers, and affecting the overall performance of the device.

In the present disclosure, through the subsequent step 230: performing plasma purge on the above-mentioned ultra-low-K dielectric layer, and in particular, performing plasma purge with oxygen helps to reorganize some bonding bonds, and being able to consume some unreacted residual gas and improve the problem of bump defects. Plasma purge is performed in the same chamber as the ultra-low-K dielectric layer formed by the CVD process described above, so that the bump defects can be removed before they are completely formed. In addition, the plasma purge step performed above can be compatible with the pre-process, does not increase the complexity of the process, and can effectively remove the bump defects in a simple method.

The above-mentioned plasma purge step needs to last for more than 2 seconds to gradually begin to improve the bump defects. Further, the duration of the plasma purge step is 4-20 seconds. When the duration of the plasma purge step is 4-20 seconds, the improvement of bump defects is significantly improved. In one embodiment, when the plasma purge is performed on the ultra-low-K dielectric layer for 15 seconds, it is found that the above-mentioned bump defects can be completely improved.

However, the preparation method provided by the present disclosure is used to prepare an ultra-low-K dielectric layer. Although plasma purge using oxygen can solve the problem of bump defects on the surface of the ultra-low-K dielectric layer, the already formed ultra-low-K dielectric layer will be eroded at the same time, resulting in over-etching of the ultra-low-K dielectric layer, and resulting in changes in the properties of the ultra-low-K dielectric layer, which causes negative effects. Therefore, even if the problem of bump defects is solved, the requirements are still not met.

For example, in the embodiment in which the ultra-low-K dielectric layer is formed by diethoxymethylsilane (DEMS) and α-terpinene, the material of the final ultra-low-K dielectric layer has the following chemistry Molecular structure formula:

If the ultra-low-K dielectric layer of the above-mentioned material is subjected to plasma purge using oxygen, O will replace the C bond in the above structure, resulting in a change in the material of the ultra-low-K dielectric layer, and affecting the performance of the ultra-low-K dielectric layer.

In order to solve the above-mentioned problem that the plasma purge on the ultra-low-K dielectric layer using oxygen will over-etch the ultra-low-K dielectric layer, and at the same time, to improve the bump defects by plasma purge, before the step 230 of performing plasma purge on the ultra-low-K dielectric layer provided by the present disclosure, the method further includes performing step 220: forming a thin oxygen layer 400 on the upper surface of the ultra-low-K dielectric layer 300, and the thin oxygen layer 400 is used as a protective layer to avoid the plasma purge using oxygen from affecting the ultra-low-K dielectric layer 300.

In one embodiment, after the ultra-low-K dielectric layer 300 is formed, since the subsequent plasma purge step using oxygen needs to be performed in the same chamber, the formation of the thin oxygen layer 400 is also performed in the same chamber.

In one embodiment, in order to be compatible with the pre-process, the thin oxygen layer 400 may be formed by a CVD process using diethoxymethylsilane (DEMS), α-terpinene, and oxygen. If the formed thin oxygen layer 400 is more inclined to be silicon oxide in terms of material, the carbon (C) content therein is small, and it is not easy to be replaced in the subsequent plasma purification step 230, which can protect the ultra-low-K dielectric layer below. Therefore, it is desirable that the material characteristics of the formed thin oxygen layer 400 are more inclined to be silicon oxide. In one embodiment, by controlling the flow rate between diethoxymethylsilane (DEMS), α-terpinene and oxygen, the thin oxygen layer 400 formed can be more inclined to be silicon oxide in terms of material.

In one embodiment, the flow rate of diethoxymethylsilane (DEMS) used to form the thin oxygen layer 400 is 400 SCCM, the flow rate of α-terpinene used is 200 SCCM, and the flow rate of oxygen used is 450 SCCM. The specific flow parameters of the gas combination used to form the thin oxygen layer with properties that are more inclined to be silicon oxide is only for illustration purposedisclosure.

The flow rate of diethoxymethylsilane (DEMS) and α-terpinene used in the gas combination for forming the thin oxygen layer 400 is smaller than that used in the gas combination for forming the ultra-low-K dielectric layer 300. On one hand, the combination of a small flow of diethoxymethylsilane (DEMS) and α-terpinene can make the material of the formed thin oxygen layer 400 more inclined to be a silicon oxide material. On the other hand, it is for the sake of saving process costs. On the other hand, the thickness of the thin oxygen layer 400 can be effectively and accurately controlled by a gas combination with a small flow rate.

Since the present disclosure aims to form an ultra-low-K dielectric layer 300, although the thin oxygen layer 400 is also an insulating material, from the perspective of device functions, the presence of the thin oxygen layer 400 will not have a negative impact on the performance of the device. However, considering device size and process cost, it is only required that the formed thin oxygen layer 400 has a thickness and protecting the ultra-low-K dielectric layer 300 below, without forming an excessively thick thin oxygen layer 400.

Moreover, in the subsequent step 230 of performing plasma purge, in order to remove the bump defects formed on the upper surface of the ultra-low-K dielectric layer 300, O2 ions need to penetrate the thin oxygen layer 400 to reach the upper surface of the ultra-low-K dielectric layer 300. Therefore, an excessively thick thin oxygen layer 400 will lead to the need to extend the execution time of the plasma purification step in order to have the same cleaning effect, which increase the time cost.

The reason why the thin oxygen layer 400 is called a 'thin' oxygen layer is that its thickness is relative to the thickness of the ultra-low-K dielectric layer 300. Further, in step 220, the thickness of the formed thin oxygen layer 400 is controlled to be 10-100 angstroms. In the above-mentioned embodiment, the thickness of the formed ultra-low-K dielectric layer 300 is 850±10% angstrom. Therefore, compared with the ultra-low-K dielectric layer 300, the oxide layer 400 can be considered as a thin oxygen layer.

In one embodiment, since the thin oxygen layer 400 mainly protects the ultra-low-K dielectric layer 300 below, in combination with the time of the subsequent plasma purge step, the thickness of the formed thin oxygen layer 400 can be controlled to 10 angstroms or slightly greater than 10 angstroms in order to better control costs and control device size.

Figure 3D:
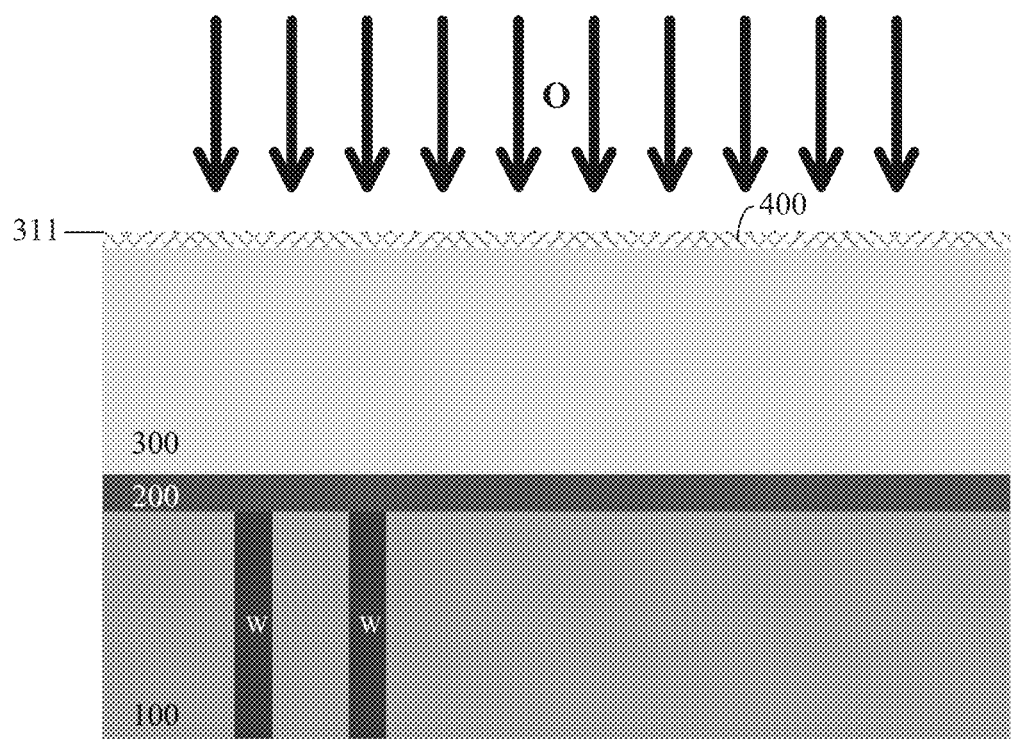

After the thin oxygen layer 400 is formed, please refer to FIG. 3D, oxygen is used to perform plasma purge on the ultra-low-K dielectric layer after the thin oxygen layer 400 is formed. As described above, performing plasma purge on the ultra-low-K dielectric layer having bump defects on the surface, and in particular, performing plasma purge with oxygen helps to reorganize some bonding bonds, and being able to consume some unreacted residual gas and improve the problem of bump defects. Plasma purge is performed in the same chamber as the ultra-low-K dielectric layer formed by the CVD process described above, so that the bump defects can be removed before they are completely formed. In addition, the plasma purge step performed above can be compatible with the pre-process, does not increase the complexity of the process, and can effectively remove the bump defects in a simple method.

The above-mentioned plasma purge step needs to last for more than 2 seconds to gradually begin to improve the bump defects. Further, the duration of the plasma purge step is 4-20 seconds. When the duration of the plasma purge step is 4-20 seconds, the improvement of bump defects is significantly improved. In one embodiment, when the plasma purge is performed on the ultra-low-K dielectric layer for 15 seconds, it is found that the above-mentioned bump defects can be completely improved.

Although the time of the plasma purge step is adjusted to 4-20 seconds (in one embodiment, 15 seconds), the thin oxygen layer 400 is formed on the upper surface of the ultra-low-K dielectric layer 300 as a barrier layer, and the K dielectric layer 300 can be protected by the thin oxygen layer 400, because the formed thin oxygen layer 400 is more inclined to be silicon oxide in terms of material, which means the amount of carbon therein is small, and it is not easy to be replaced in the plasma purge step 230. Further, the thickness of the thin oxygen layer 400 is controlled so that O2 ions can pass through the thin oxygen layer 400 to remove the bump defects 311 on the upper surface of the ultra-low-K dielectric layer 300, and at the same time, O2 ions can be effectively prevented from over-etching the ultra-low-K dielectric layer 300. Thus, it guarantees that the ultra-low-K dielectric layer 300 retains the original electrical characteristics, removes bump defects, and has a flat surface.

In one embodiment, the flow rate of diethoxymethylsilane (DEMS) used to form the ultra-low-K dielectric layer 300 is 2400±10% SCCM, the flow rate of α-terpinene is 3500±10% SCCM, and the reaction temperature is 400 degrees Celsius to form an ultra-low-K dielectric layer 300 having a thickness of 850±10% angstroms. The flow rate of diethoxymethylsilane (DEMS) used to form the thin oxygen layer 400 is 400 SCCM, the flow rate of α-terpinene used is 200 SCCM, and the flow rate of oxygen used is 450 SCCM to form a thin oxygen layer 400 having a thickness of 10 angstroms. The step of plasma purge with oxygen lasts 15 seconds.

Figure 3E:
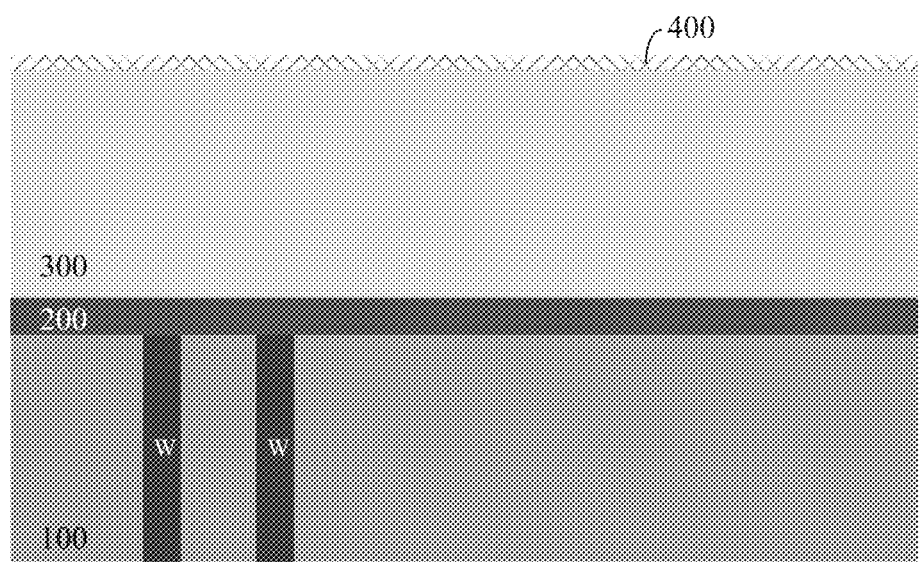

The device structure after the operation according to the combined parameter provided in the above embodiment is referred to FIG. 3E. The bump defects on the upper surface of the ultra-low-K dielectric layer 300 formed according to the above combined parameter have been completely removed, and the surface of the formed dielectric layer is flat, which will not affect the properties of the formed dielectric layer, will not affect the formation of subsequent film layers, therefore, can effectively improve device performance.

With above in mind, embodiments of the manufacturing method provided by the present disclosure have been described. The ultra-low K dielectric layer prepared according to the manufacturing method provided by the disclosure has a smooth surface, overcomes the original bump defects of the ultra-low K dielectric layer, and improves the performance of the ultra-low K dielectric layer. The manufacturing method of the ultra-low K dielectric layer provided by the disclosure makes the surface of the manufactured ultra-low K dielectric layer smooth and overcomes the original bump defects by additionally forming a thin oxygen layer as a protective layer in the original process and adjusting the process parameters of the plasma purge step, and not adversely affect the performance of the ultra-low K dielectric layer. The manufacturing method provided by the disclosure has a simple process, which is compatible with the manufacturing process of the existing ultra-low K dielectric layer, and has operability.

The disclosure also provides an ultra-low-K dielectric layer manufactured by using the above-mentioned manufacturing method. The surface of the ultra-low-K dielectric layer is flat and has no bump defects, which can ensure the characteristics of the ultra-low-K dielectric layer, and effectively play the role of insulation between the BEOL metals.

The disclosure also provides a semiconductor device including the ultra-low-K dielectric layer. The semiconductor device adopts the ultra-low-K dielectric layer, which effectively plays the role of insulation between the BEOL metals, and can effectively reduce the interconnection capacitance and improve the response speed and performance of the device.

Heretofore, embodiments of an ultra-low K dielectric layer and its manufacturing method have been described. Although the present disclosure has been described with respect to exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A manufacturing method for an ultra-low K dielectric layer, the manufacturing method comprising:
    forming an ultra-low K dielectric layer on a substrate, ultra-low K dielectric layer being characterized by a molecular structure comprising a C bond;
    forming an oxygen layer on an upper surface of the ultra-low K dielectric layer, the oxygen layer being characterized by a thickness of less than 100 angstroms;
    performing plasma purge using oxygen on the ultra-low K dielectric layer after forming the oxygen layer, the oxygen layer allowing the oxygen to reach a surface of the ultra-low K dielectric layer and protecting the C bond;
    wherein the plasma purge lasts for more than 2 seconds.

2. The manufacturing method according to claim 1, wherein the plasma purge lasts for 4 to 20 seconds.

3. The manufacturing method according to claim 2, wherein the plasma purge lasts for 15 seconds.

4. The manufacturing method according to claim 1, wherein the oxygen layer has a thickness of 10 angstroms.

5. The manufacturing method according to claim 1, wherein the thin oxygen layer is formed using diethoxymethylsilane, α-terpinene and oxygen.

6. The manufacturing method according to claim 5, wherein the ultra-low K dielectric layer is formed using diethoxymethylsilane and α-terpinene; wherein
    a flow rate of diethoxymethylsilane and α-terpinene used to form the thin oxygen layer is smaller than a flow rate of diethoxymethylsilane and α-terpineene used to form the ultra-low K dielectric layer.

7. The manufacturing method according to claim 6, wherein for forming the thin oxygen layer, the flow rate of diethoxymethylsilane used is 400 sccm, a flow rate of α-terpinene used is 200 sccm, and a flow rate of oxygen used is 450 sccm.

8. The manufacturing method according to claim 1, wherein the steps of forming the ultra-low K dielectric layer, forming the thin oxygen layer, and performing the plasma purge are continuously performed in a same reaction chamber.

9. An ultra-low K dielectric layer manufactured by the manufacturing method according to any one of claim 1.

10. A semiconductor device comprising the ultra-low K dielectric layer of claim 9.

11. A manufacturing method for an ultra-low K dielectric layer, the manufacturing method comprising:
    depositing an ultra-low K dielectric layer on a substrate in a reaction chamber, ultra-low K dielectric layer being characterized by a molecular structure comprising a C bond, the ultra-low K dielectric layer comprising a top surface, the top surface comprising bump defects;
    depositing an oxygen layer on an upper surface of the ultra-low K dielectric layer in the reaction chamber, the oxygen layer being characterized by a thickness of less than 100 angstroms; and
    performing plasma purge using oxygen molecules to remove the bump defects in the reaction chamber, the oxygen molecules penetrating the oxygen layer to reach the top surface within 20 seconds and protecting the C bond.

12. The method of claim 11 wherein the ultra-low K dielectric layer is characterized by a thickness of at least 750 angstroms.

13. The method of claim 11 wherein the oxygen layer comprises silicon oxide material.

14. The method of claim 11 wherein the oxygen layer comprises low level, relative to an oxygen level, of carbon content.

15. The method of claim 11 wherein the bump defects comprise unreacted gases.

16. The method of claim 11 wherein the oxygen molecules consume the bump defects.

* * * * *